(12) United States Patent
Shih et al.

(10) Patent No.: US 7,913,219 B2
(45) Date of Patent: Mar. 22, 2011

(54) ORIENTATION OPTIMIZATION METHOD OF 2-PIN LOGIC CELL

(75) Inventors: Ying-An Shih, Hsinchu (TW); Hung-Ming Chen, Hsinchu (TW)

(73) Assignee: RDC Semiconductor Co., Ltd., Hsinchu (TW)

( * ) Notice: Subject to any disclaimer, the term of this patent is extended or adjusted under 35 U.S.C. 154(b) by 392 days.

(21) Appl. No.: 12/147,729

(22) Filed: Jun. 27, 2008

(65) Prior Publication Data
US 2009/0235210 A1 Sep. 17, 2009

(30) Foreign Application Priority Data
Mar. 11, 2008 (TW) ................ 97108511 A

(51) Int. Cl.
*G06F 17/50* (2006.01)
(52) U.S. Cl. ......... 716/132; 716/119; 716/122; 716/123
(58) Field of Classification Search .............. 716/2, 9, 716/10, 11, 119, 122, 123, 132
See application file for complete search history.

(56) References Cited

U.S. PATENT DOCUMENTS
2007/0204252 A1 8/2007 Furnish et al.

OTHER PUBLICATIONS

Alupoaei et al.,"Net-Based Force-Directed Macrocell Placement for Wirelength Optimization", Dec. 2002, IEEE Transactions on Very Large Scale Integration (VLSI) Systems, vol. 10, No. 6, pp. 824-835.*
Momenzadeh et al.,"Characterization, Test, and Logic Synthesis of And-Or-Invertor (AOI) Gate Design for QCA Implementation", Dec. 2005, IEEE Transactions on Computer-Aided Design of Integrated Circuits and Systems, vol. 24, No. 12, pp. 1881-1893.*

* cited by examiner

*Primary Examiner* — Sun J Lin
(74) *Attorney, Agent, or Firm* — WPAT, PC; Justin King

(57) ABSTRACT

In an orientation optimization, at least one signal chain path starting from a signal source and passing through a series of M 2-pin logic cells is located according to a netlist. An output of the Nth 2-pin logic cell in the series of M 2-pin logic cells, where N<M, is set as a gravity point to attract an input of the (N+1)th 2-pin logic cell, thereby optionally flipping the (N+1)th 2-pin logic cell.

20 Claims, 16 Drawing Sheets

|  | μC1 | μC2 | μC3 |
|---|---|---|---|
| No. of standard logic cells | 177393 | 184131 | 186647 |
| Chip area | 1774 X 1995 | 1774 X 1995 | 1774 X 1995 |
| Total routing length without orientation optimization | 8342801 $\mu m$ | 8896615 $\mu m$ | 8813543 $\mu m$ |
| Total routing length with orientation optimization | 8337571 $\mu m$ | 8887140 $\mu m$ | 8806783 $\mu m$ |
| Routing length reduction | -5230 $\mu m$ | -9475 $\mu m$ | -6760 $\mu m$ |
| No. of 2-pin logic cells | 60043 | 64703 | 65463 |
| No. of flipped cells | 18837 | 22199 | 19755 |
| Run time | 1 min | 1 min | 1 min |

FIG. 7

ORIENTATION OPTIMIZATION METHOD OF 2-PIN LOGIC CELL

FIELD OF THE INVENTION

The present invention relates to a method for determining orientation of a 2-pin logic cell, and more particularly to a method for determining an optimal orientation of a 2-pin logic cell disposed in a signal chain path for obtaining a physical circuit corresponding to an IC design.

BACKGROUND OF THE INVENTION

In an IC design flow based on a cell-based library, hardware descriptions such as Verilog's netlist are used to describe involving standard logic cells and nets. The netlist is then processed for physical design. Meanwhile, 2-pin logic cells are commonly used in the physical design for specific circuitry requirements and integrated signal transmission.

A generally adopted placement stage of IC logic cells includes placement of standard logic cells based on a timing driven strategy and a wire-length driven strategy.

In the so-called timing driven strategy, signal path delay time indicative of a duration when a signal is transmitted from an input end to an output end of each signal transmission path is calculated in order to determine the placement sequence of the standard logic cells. Among a plurality of paths, the path involving a longer signal path delay time has a higher priority to be placed so that the standard logic cells in that path is made closer to one another compared to those in other paths. In this way, the overall propagation delay in the physical circuit can be reduced.

On the other hand, in the so-called wire-length driven strategy, signal routing length indicative of a distance from an input end to an output end of each signal transmission path is calculated in order to determine the placement sequence of the standard logic cells. Among a plurality of paths, the path involving a longer signal routing length has a higher priority to be placed so that the standard logic cells in that path is made closer to one another compared to those in other paths. In this way, the overall routing length in the physical circuit can be reduced.

However, none of the current computer-aided design tools involves optimized orientation of 2-bin logic cells to further reduce propagation delay and routing length. It is desirable to implement the optimization of orientation prior to or following the placement stage with a feature of single input and single output, which is further advantageous in avoiding wire crossing.

Please refer to FIG. 1A. A signal transmission path inclusive of 2-pin logic cells without orientation optimization after the placement stage is exemplified. In the figure, relatively large rectangles represent 2-pin logic cells including a first 2-pin logic cell L1, a second 2-pin logic cell L2, and a third 2-pin logic cell L3. The circles in each 2-pin logic cell indicates its input terminal (in) and output terminal (out); and the squares are vias V1~V13 for connecting different metal layers.

As shown in FIG. 1A, signal transmission is performed rightwards and passes the first 2-pin logic cell L1, the second 2-pin logic cell L2, and the third 2-pin logic cell L3 in sequence. The input in of the first 2-pin logic cell L1 is disposed at the right side and coupled to the output out0 of a preceding stage of 2-pin logic cell (not shown); the output out1 of the first 2-pin logic cell L1 is disposed at the left side and coupled to the input in2 of the second 2-pin logic cell L2 disposed at the right side; the output out2 of the second 2-pin logic cell L2 is disposed at the left side and coupled to the input in3 of the third 2-pin logic cell L3 disposed at the right side; and the output out3 of the third 2-pin logic cell L3 is disposed at the left side and coupled to the input in4 of next stage of 2-pin logic cell L3 (not shown).

It is apparent that wire crossing occurs in the above-described signal transmission path. Practically, plural metal layers and vias are essential to wiring procedures in an IC manufacturing process. For example, Via number 0 (V0), Via number 1 (V1), Via number 2 (V2), Via number 3 (V3), Via number 4 (V4), Via number 5 (V5) and Via number 6 (V6) are used to connect a first metal layer to a second metal layer; and Via number 7 (V7), Via number 8 (V8), Via number 9 (V9), Via number 10 (V10), Via number 11 (V11), Via number 12 (V12) and Via number 13 (V13) are used to connect the second metal layer to a third metal layer. Furthermore, a wire m0 is a wire of the first metal layer; wires m1, m3, m4, m6, m7, m9 and m10 are wires of the second metal layer; and wires m2, m5, m8 and m11 are wires of the third metal layer.

In other words, the input in1 of the first 2-pin logic cell L1 is coupled to the output out0 of the preceding stage through the via V2, the wire m3 of the second metal layer, the via V9, the wire m2 of the third metal layer, the via V7, the wire m1 of the second metal layer, the via V0 and the wire m0 of the first metal layer; the output out1 of the first 2-pin logic cell L1 is coupled to the input in2 of the second 2-pin logic cell L2 through the via V1, the wire m4 of the second metal layer, the via V8, the wire m5 of the third metal layer, the via V11, the wire m6 of the second metal layer, and the via V4; and so on. The output out3 of the third 2-pin logic cell L3 is coupled to the input in4 of the next stage through the via V5, the wire m10 of the second metal layer, the via V12, and the wire m11 of the third metal layer.

It can be seen from the above example that without orientation optimization, three metal connecting layers and fourteen vias are required for the connection between the output out0 of the preceding stage and the input in4 of the next stage. The connection among cells is quite complicated.

With orientation optimization of logic cells during the placement stage, the connection would become that shown in FIG. 1B. That is, all the input terminals (in1, in2, in3) of the first 2-pin logic cell L1, the second 2-pin logic cell L2, and the third 2-pin logic cell L3 are disposed at respective left sides; and all the output terminals (out1, out2, out3) of the first 2-pin logic cell L1, the second 2-pin logic cell L2, and the third 2-pin logic cell L3 are disposed at respective right sides. Apparently, wire crossing is diminished, and only wires m0, m1, m2 and m3 are required for the connection between the output out0 of the preceding stage and the input in4 of the next stage.

Comparing the situation shown in FIG. 1A with that shown in FIG. 1B, it is understood that orientation optimization performed at proper timing may practically reduce the overall routing length. However, an IC generally includes tens to hundreds of thousand 2-pin logic cells, and the interconnection among the cells is variable instead of always lining left to right. Other circuitry such as a clock tree including a series of buffers is even formed with branches which are variously oriented paths. Therefore, it is a challenge to properly adjust the orientation of the cells.

An orientation optimization method was proposed in the Design Automation Conference held in USA in 2006. The method has a "Nets-based flip" structure, which will be described hereinafter with reference to FIG. 2A~2D.

In the case of FIG. 2A, a first 2-pin logic cell L1 in a first stage needs to transmit signals to three second-stage 2-pin logic cells, which are arranged up to down in sequence as the second 2-pin logic cell L2, the third 2-pin logic cell L3 and the fourth 2-pin logic cell L4. As shown, the input (in1) of the first 2-pin logic cell L1 is disposed at the left side while the output (out1) is disposed at the right side; the input (in2) of the second 2-pin logic cell L2 is disposed at the left side while the output (out2) is disposed at the right side; the input (in3) of the third 2-pin logic cell L3 is disposed at the right side while the output (out3) is disposed at the left side; and the input (in4) of the fourth 2-pin logic cell L4 is disposed at the left side while the output (out4) is disposed at the right side. By connecting the output (out1) of the first 2-pin logic cell L1 with the inputs (in1, in2, in3) of the three second-stage 2-pin logic cells L2, L3 and L4, a net bounding box 21 is defined.

Please refer to FIG. 2A. Solid lines are used to show the net bounding box 21 connecting the output (out1) of the first 2-pin logic cell L1 with the inputs (in1, in2, in3) of the three second-stage 2-pin logic cells L2, L3 and L4. In contrast, dash lines are used to show the shortest distance of connection. It can be seen from the illustration that the shortest routing length required to connect these logic cells is a half of the circumference of the net bounding box 21 (half perimeter bounding box).

In principle, the smaller the net bounding box, the shorter the routing length. Therefore, it would be desired to flip the third 2-pin logic cell L3 along the Y-axis. That is, the input (in3) of the third 2-pin logic cell L3 is made to be disposed at the left side, and the output (out3) is made to be disposed at the right side. Accordingly, a new net bounding box 22 is obtained. In brief, nets-based flip is to locate a net bounding box, and properly flip one or more 2-pin logic cells involved to realize a smallest net bounding box so as to minimize the routing length.

Nevertheless, it is to be noted that according to the "nets-based flip" method, the flip of a cell is forbidden if the flip resulting in the size reduction of a net bounding box meanwhile results in size enlargement of a net bounding box in next stage. It is because the overall routing length might be contrarily enlarged.

For example, referring to FIG. 2C, the output (out3) of the third 2-pin logic cell L3 in the second stage is further connected to inputs (in5, in6) of two 2-pin logic cells L5 and L6 in the third stage, wherein the input (in5) of the fifth 2-pin logic cell L5 is disposed at the right side while the output (out5) is disposed at the left side; the input (in6) of the sixth 2-pin logic cell L6 is disposed at the right side while the output (out6) is disposed at the left side. As shown, the 2-pin logic cells in the first and the second stages form the net bounding box 21 while those in the second and third stages form another net bounding box 23.

For reducing the size of the net bounding box 21, it is intended to flip the third 2-pin logic cell L3. That is, the input (in3) of the third 2-pin logic cell L3 is changed to be disposed at the left side, and the output (out3) is changed to be disposed at the right side, as shown in FIG. 2D. Accordingly, the new net bounding box 22 with a reduced size is obtained. However, the size of another new net bounding box 24 derived from the third net bounding box due to the flip of the third 2-pin logic cell L3 is enlarged. Thus the flip is forbidden according to the definition of conventional "nets-based flip" algorithm.

In addition to the above-described "nets-based flip" structure, U.S. Patent Publication No. US2007/0204252 also suggests an improved "nets-based flip" method, which is to be incorporated herein for reference.

Nevertheless, the conventional "nets-based flip" methods have difficulties in dealing with a situation that signal transmission is implemented with branched paths so that the conventional "nets-based flip" methods could not accurately determine the 2-pin logic cell in which stage is to be flipped.

A clock tree exemplified in FIG. 3A is used for illustrating branched paths. First of all, for equalizing delay time of clock signals, the 2-pin logic cells of the clock tree are allocated to form an H-shaped tree (H tree). As shown, a clock signal is transmitted from a first 2-pin logic cell L1 to a second 2-pin logic cell L2, and then four branched clock signals are transmitted from the second 2-pin logic cell L2 to a third 2-pin logic cell L3, a fourth 2-pin logic cell L4, a fifth 2-pin logic cell L5 and a sixth 2-pin logic cell L6, following H-tree paths.

Subsequently, at the ends of the branched paths, clock signals are transmitted from the outputs (out3, out4, out5, out6) of the 2-pin logic cells L3, L4, L5 and L6 to respective four standard logic cells in need of the clock signals. The four standard logic cells associated with the third 2-pin logic cell L3 are connected to the output (out3) of the third 2-pin logic cell L3 with respective inputs clk3a, clk3b, clk3c and clk3d. The four standard logic cells associated with the third 2-pin logic cell L4 are connected to the output (out4) of the third 2-pin logic cell L4 with respective inputs clk4a, clk4b, clk4c and clk4d. Likewise, the four standard logic cells associated with the third 2-pin logic cell L5 are connected to the output (out5) of the third 2-pin logic cell L5 with respective inputs clk5a, clk5b, clk5c and clk5d; and the four standard logic cells associated with the third 2-pin logic cell L6 are connected to the output (out6) of the third 2-pin logic cell L6 with respective inputs clk6a, clk6b, clk6c and clk6d. The standard logic cells, for example, are D flip-flop cells including an input terminal (Din), an output terminal (Dout) and a clock input terminal (clk).

It can be seen from FIG. 3A that the clock signal path extends from the output (out1) of the first 2-pin logic cell L1 to the input (in2) of the second 2-pin logic cell L2, and then from the output (out2) of the second 2-pin logic cell L2 to respective inputs (in3, in4, in5, in6) of the four parallel 2-pin logic cells L3, L4, L5 and L6. In a case that three net bounding boxes are associated with the third 2-pin logic cell L3, e.g. a first net bounding box 31 of its input (in3) connecting the output (out2), the input (in3) and the input (in5), a second net bounding box 32 of its output (out3) connecting the output (out3), the input (clk3b) and the input (clk3d), and a third net bounding box 33 of its input (in3) connecting the output (out3), the input (clk3a) and the input (clk3c).

The net bounding boxes constructed without flipping are illustrated in FIG. 3B, while the net bounding boxes constructed with flipping are illustrated in FIG. 3C. As showing in FIG. 3C, the third 2-pin logic cells L3 and the fifth 2-pin logic cells L5 are flipped so as to make the inputs (in3, in5) closer to the output (out2) of the second 2-pin logic cells L2, thereby contracting the first net bounding box 31. Comparing FIG. 3C with FIG. 3B, the flip of the third 2-pin logic cells L3, although reducing the size of the first net bounding box 31, enlarging the size of the second net bounding box 32 at the same time. Therefore, the flipping is forbidden in principle.

It is to be noted that although the size of the second net bounding box 32 is enlarged along with the size reduction of the first net bounding box 31, the size of the third net bounding box 33 is simultaneously reduced. As a whole, the flipping is still advantageous because the size of the first net bounding box 31 is reduced and the changes of the second and third net bounding boxes 32 and 33 are offset. Therefore, it is improper to determine that a 2-pin logic cell should not be flipped simply due to the increasing size of the associated net bounding box in next stage.

SUMMARY OF THE INVENTION

Therefore, the present invention provides an orientation optimization method to determine an optimal flipping condition.

In an aspect, the present invention provides an orientation optimization which includes: locating at least one signal chain path starting from a signal source and passing through a series of M 2-pin logic cells; and setting an output of the Nth 2-pin logic cell in the series of M 2-pin logic cells, where N<M, as a gravity point to attract an input of the (N+1)th 2-pin logic cell, thereby optionally flipping the (N+1)th 2-pin logic cell.

In another aspect, the present invention provides a physical design method which comprise: establishing a netlist which describes signal interconnection among A 2-pin logic cells; performing a placement stage of the A 2-pin logic cells; synthesizing a clock tree with the addition of B 2-pin logic cells and signal interconnection among the B 2-pin logic cells; performing timing optimization to optionally change a size of the (A+B) 2-pin logic cells and optionally add C 2-pin logic cells; performing orientation optimization based on paths-based flip to optionally flip the (A+B+C) 2-pin logic cells; and performing routing to obtain a physical circuit.

In a further aspect, the present invention provides a physical design method, which includes: establishing a netlist which describes signal interconnection among A 2-pin logic cells; performing a placement stage of the A 2-pin logic cells; performing orientation optimization based on paths-based flip to optionally flip the A 2-pin logic cells; synthesizing a clock tree with the addition of B 2-pin logic cells and signal interconnection among the B 2-pin logic cells; performing timing optimization to optionally change a size and/or number of 2-pin logic cells; performing orientation optimization based on paths-based flip to optionally flip the added 2-pin logic cells; and performing routing to obtain a physical circuit.

The 2-pin logic cells, for example, are an inverter, a buffer or a delay element.

BRIEF DESCRIPTION OF THE DRAWINGS

The above contents of the present invention will become more readily apparent to those ordinarily skilled in the art after reviewing the following detailed description and accompanying drawings, in which:

FIG. 7 is a table of statistical data showing reduced routing length for three physical designs of microcontrollers;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

According to an orientation optimization method of the present invention, a "paths-based flip" algorithm is adopted. For all 2-pin logic cells including inverters, buffers and delay cells, the "paths-based flip" orientation optimization method applies.

Figures 1A, 1B:
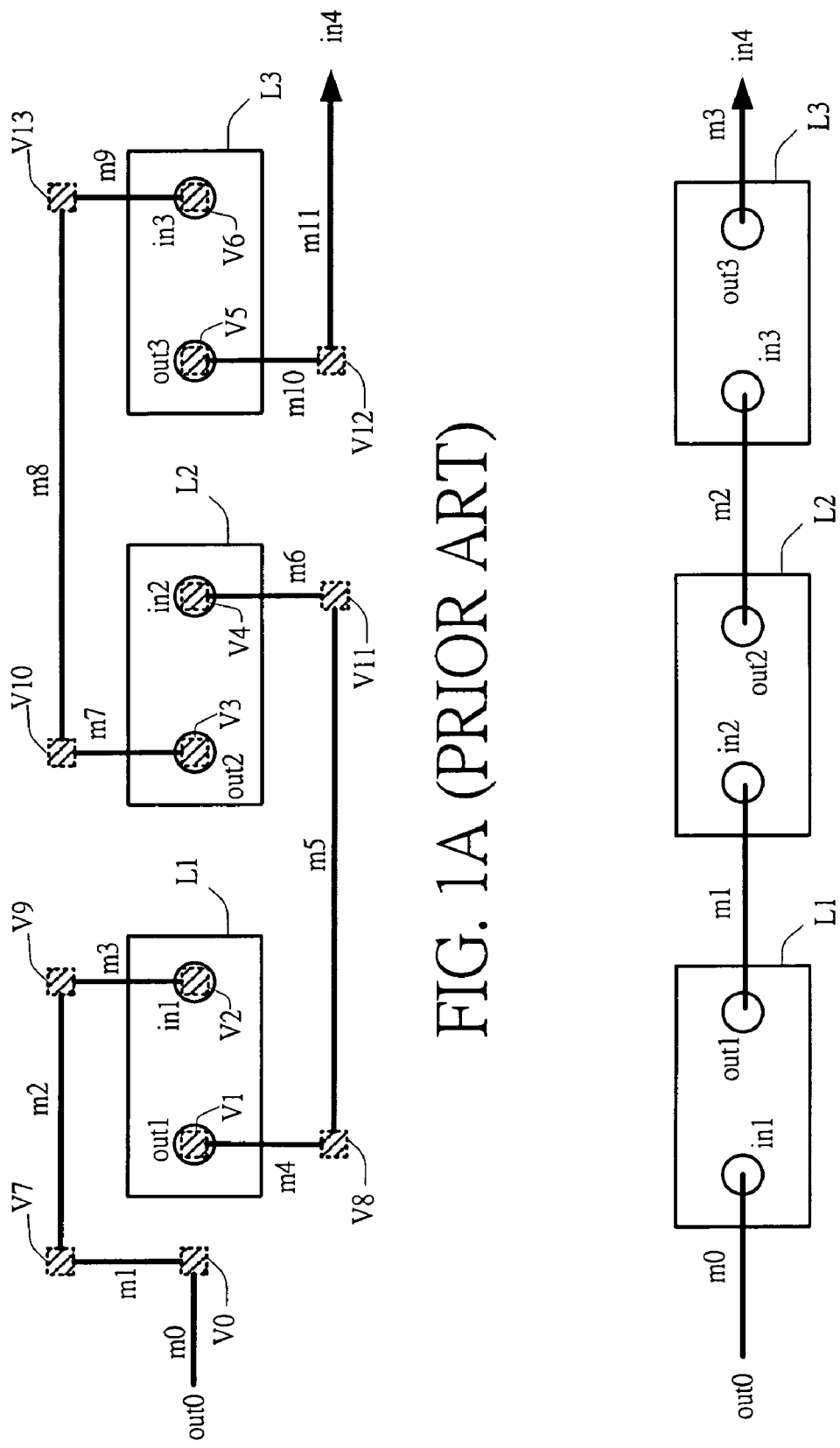
FIG. 1A is a scheme illustrating a physical design without orientation optimization.
FIG. 1B is a scheme illustrating the physical design of FIG. 1A after orientation optimization based on prior art.
Figure 2A:
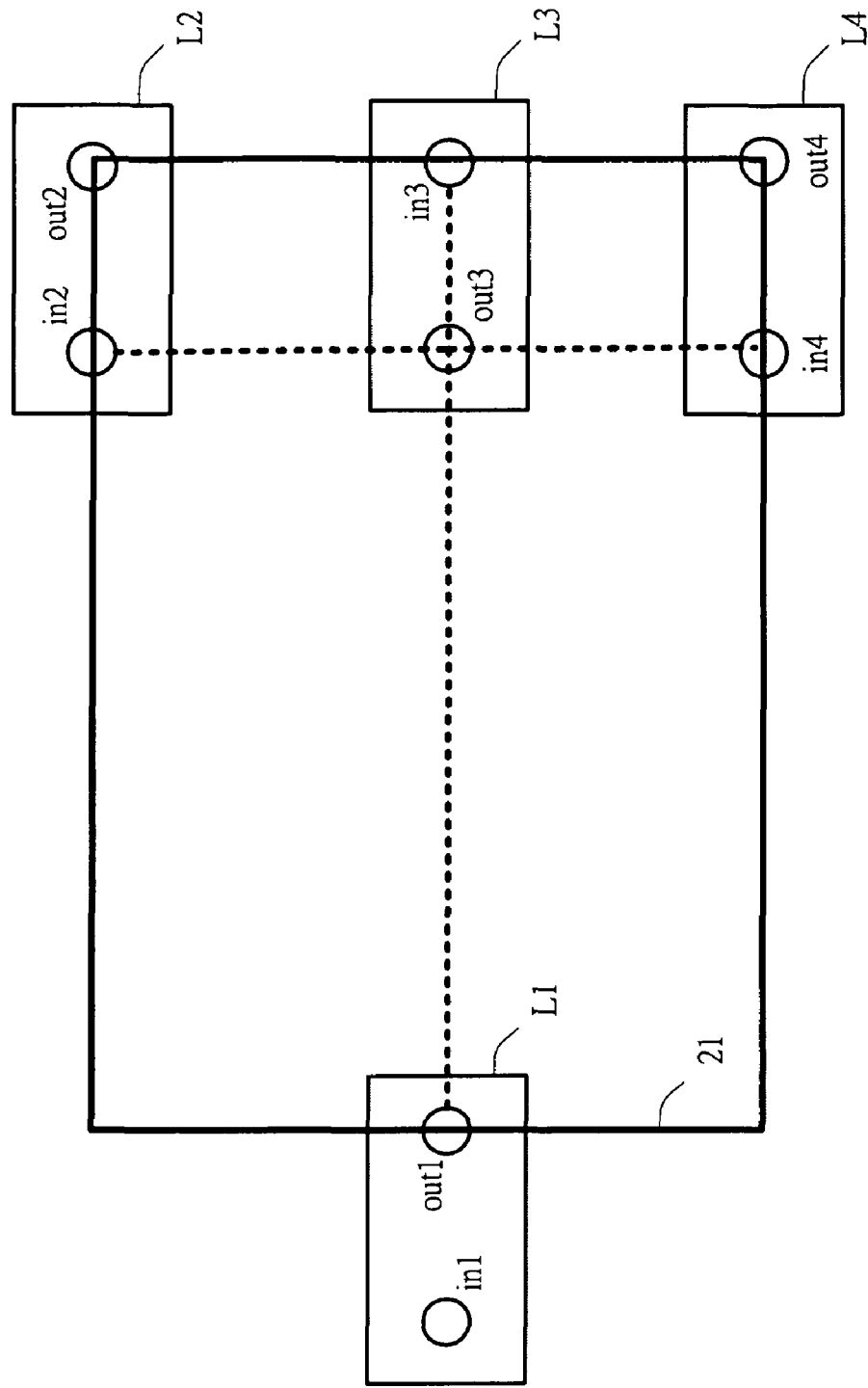
FIG. 2A is a scheme illustrating another physical design without orientation optimization.
Figure 2B:
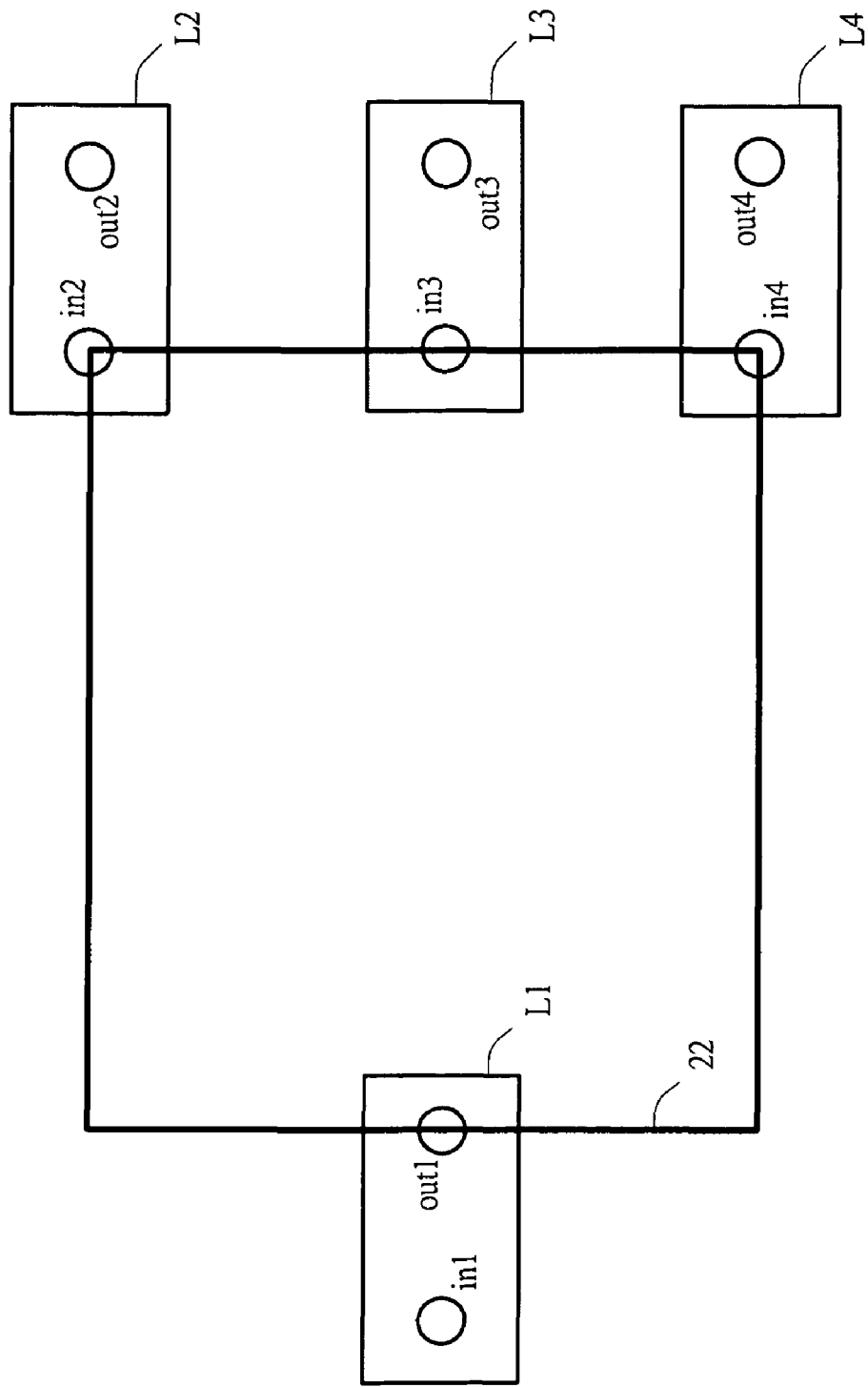
FIG. 2B is a scheme illustrating the physical design of FIG. 2A after orientation optimization based on prior art.
Figure 2C:
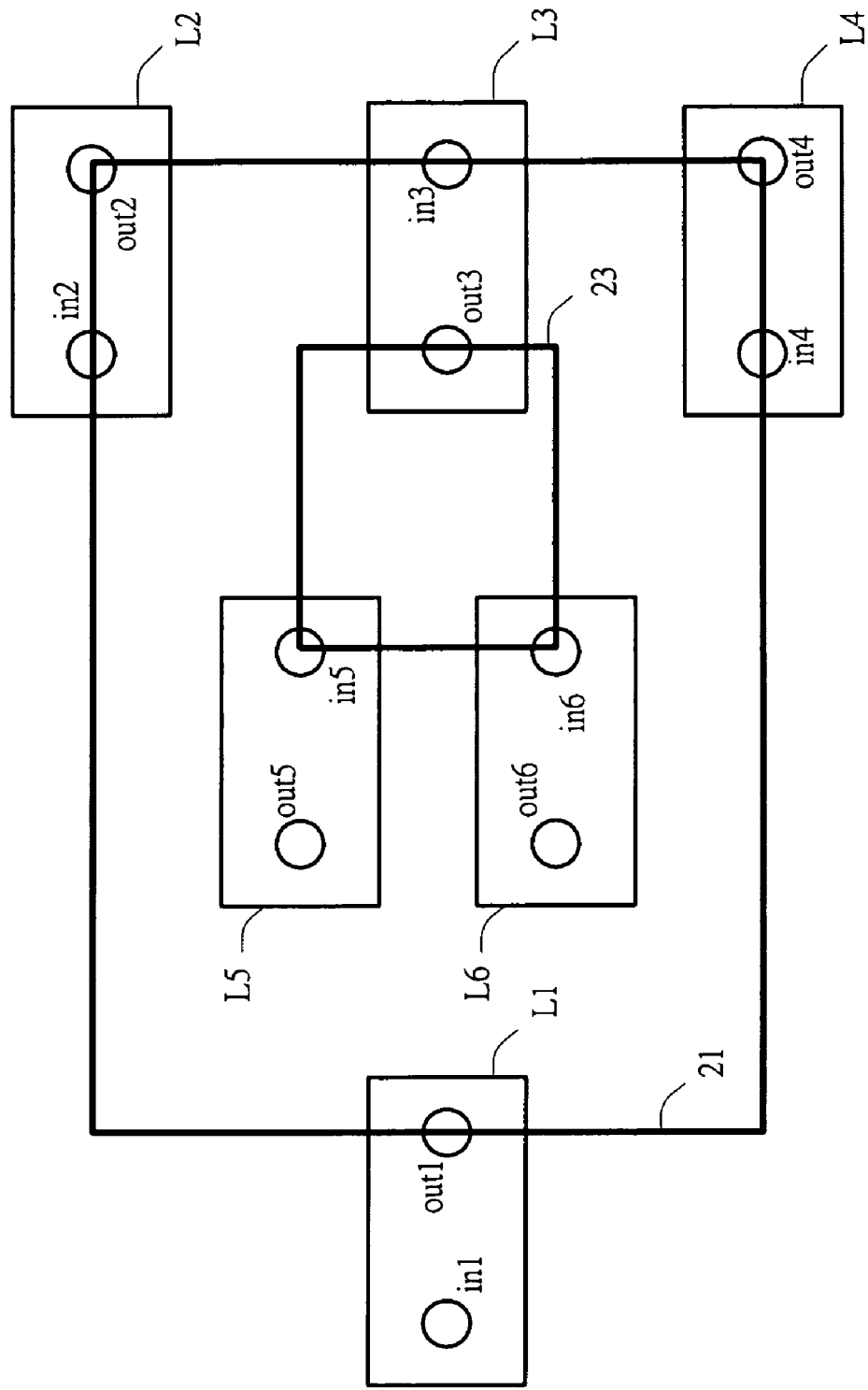
FIG. 2C is a scheme illustrating the physical design of FIG. 2A added with next-stage 2-pin logic cells.
Figure 2D:
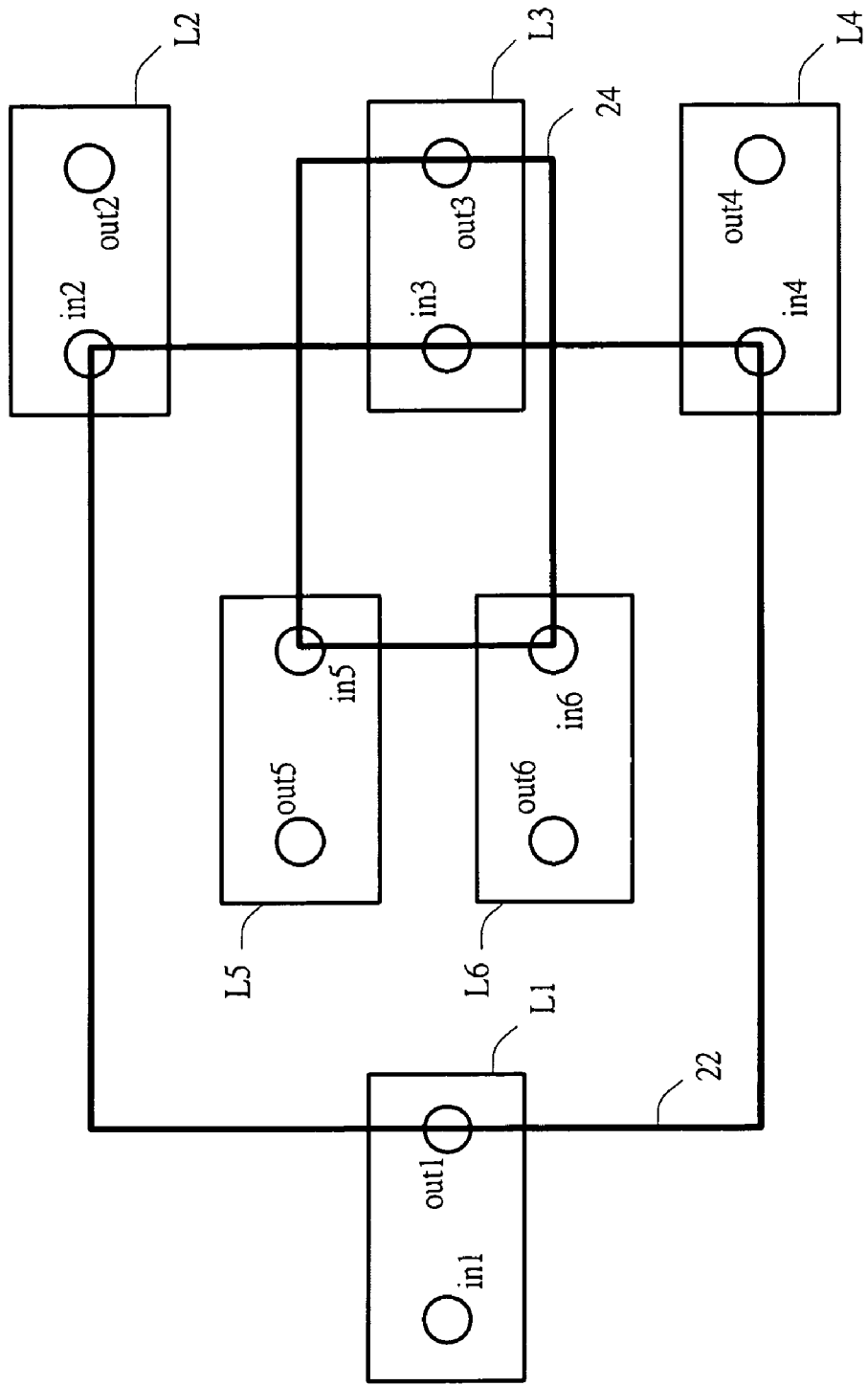
FIG. 2D is a scheme illustrating the physical design of FIG. 2C, which is referred to describe why the orientation optimization as shown in FIG. 2B is forbidden based on prior art.
Figure 3A:
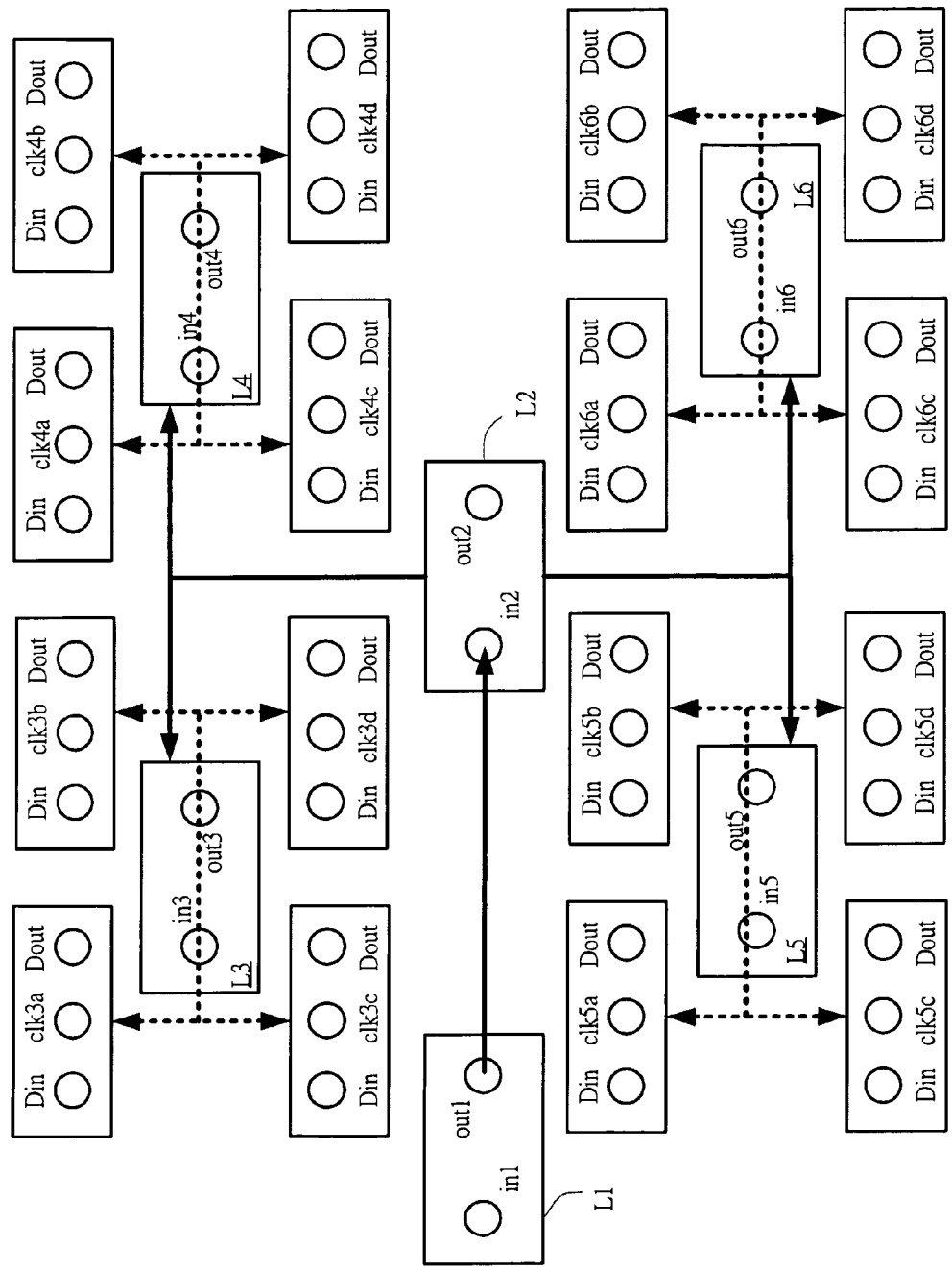
FIG. 3A is a scheme illustrating a further physical design without orientation optimization.
Figure 3B:
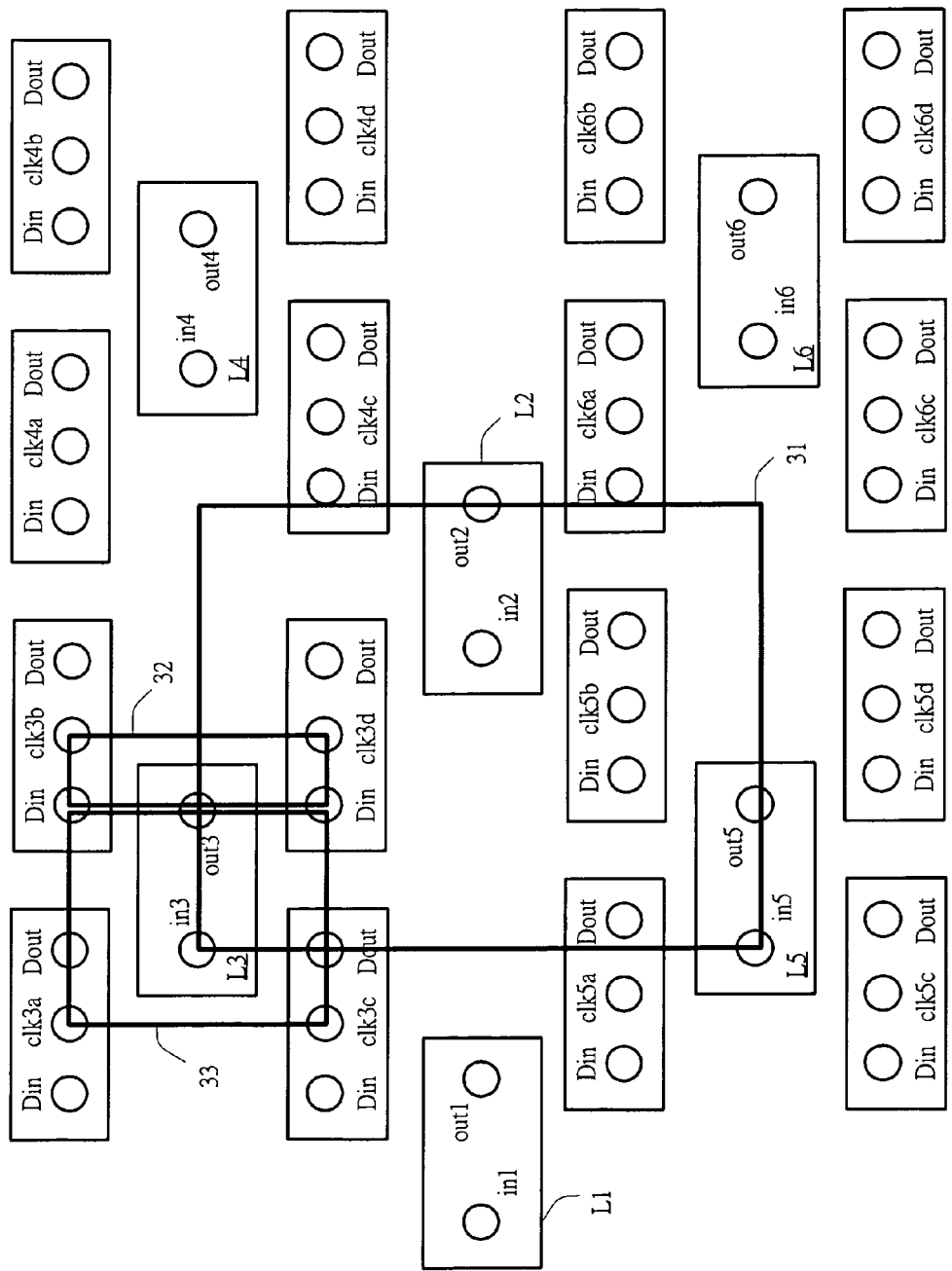
FIG. 3B and FIG. 3C are schemes illustrating possible routing length variation before and after orientation optimization based on prior art.
Figure 3C:
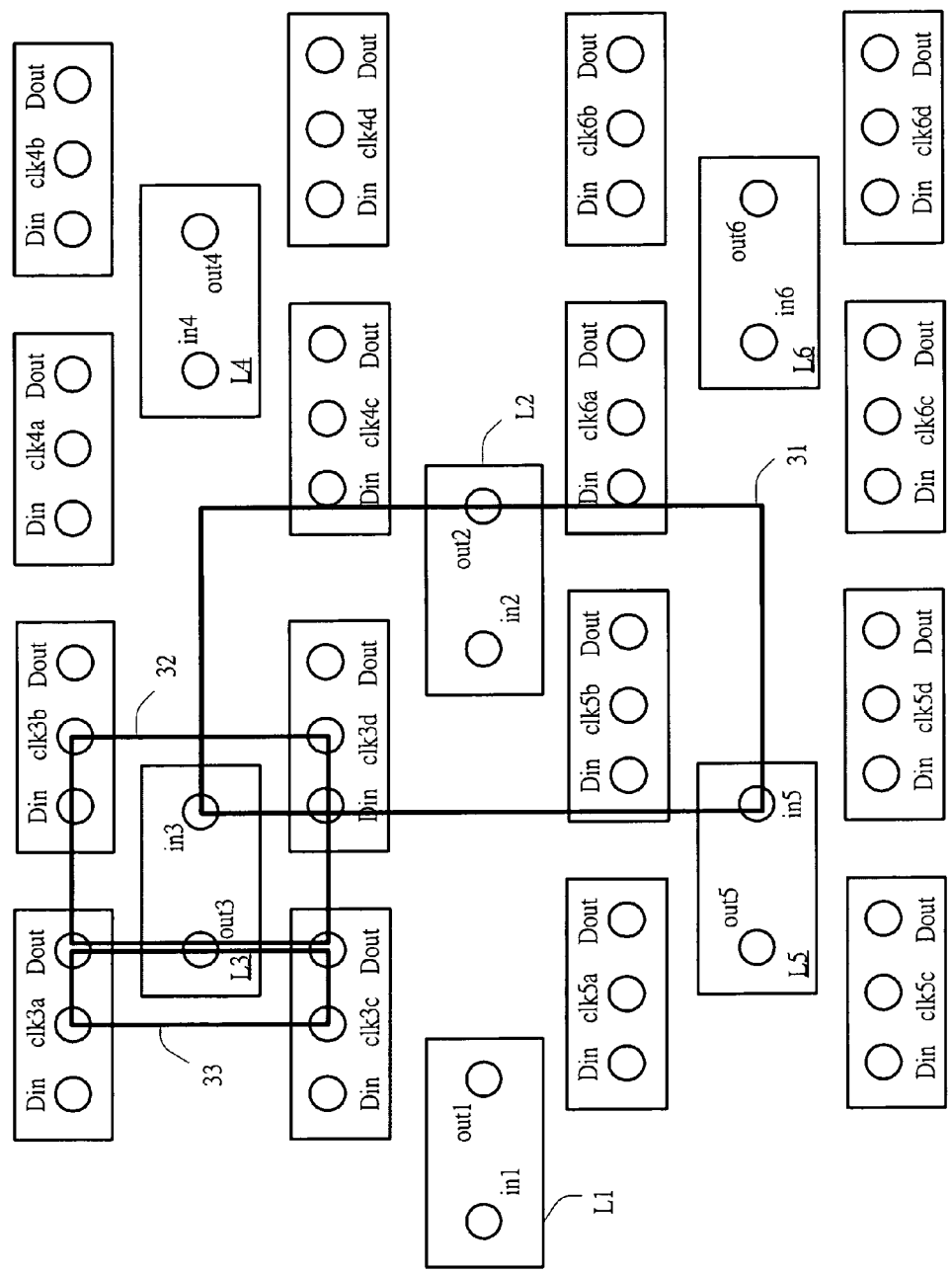
Figure 4:
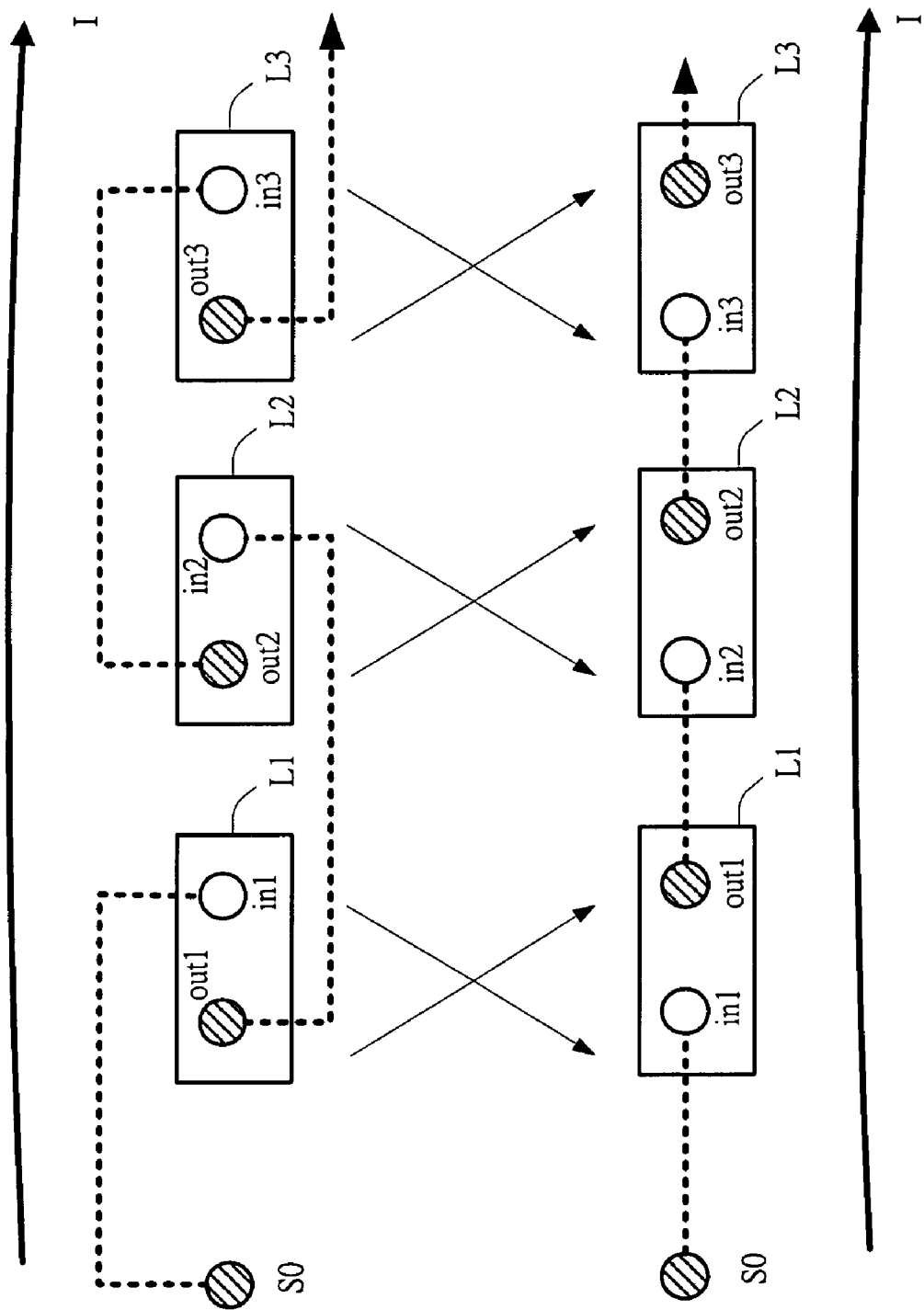
FIG. 4 is a scheme illustrating a first example of physical design with orientation optimization according to the present invention.

Please refer to FIG. 4. A simple circuitry is exemplified to describe the "paths-based flip" orientation optimization method according to an embodiment of the present invention. The routing starts from a signal source s0 and extends through three 2-pin logic cells L1, L2 and L3 in sequence, thereby constituting a signal chain path I. For attracting inputs (in1, in2, in3) of all the three 2-pin logic cells L1, L2 and L3 in next stage, the signal source s0 and all the outputs (out1, out2, out3) of the three 2-pin logic cells L1, L2 and L3 are set as gravity points. Accordingly, the orientation optimization can be achieved by changing the placement orientation of standard 2-pin logic cells in a stage due to the attraction of their inputs by the gravity points of a preceding stage.

In more detail, since the signal source s0 is set as one of the gravity points, the first 2-pin logic cell L1 should be flipped due to the attraction of its input (in1) by the signal source s0 during the placement of the first 2-pin logic cell L1. Similarly, the second 2-pin logic cell L2 should be flipped during the placement of the second 2-pin logic cell L2 because its input (in2) is attracted by the output (out1) of the first 2-pin logic cell L1; and the third 2-pin logic cell L3 should be flipped during the placement of the third 2-pin logic cell L3 because its input (in3) is attracted by the output (out2) of the second 2-pin logic cell L2. In this way, the signal chain path I will not change after placement, but the total routing length can be reduced and no wire crossing occurs.

After a netlist such as Verilog's netlist completes describing the signal interconnection among the standard logic cells, signal chain paths formed by serially connecting respectively associated 2-pin logic cells are located while entering the placement stage or performing timing optimization. Then, outputs of all the standard 2-pin logic cells in the signal chain paths are set as gravity points, and the placement orientation of standard 2-pin logic cells in a stage changes due to the attraction of their inputs by the gravity points of a preceding stage, thereby achieving the object of orientation optimization.

Figure 5A:
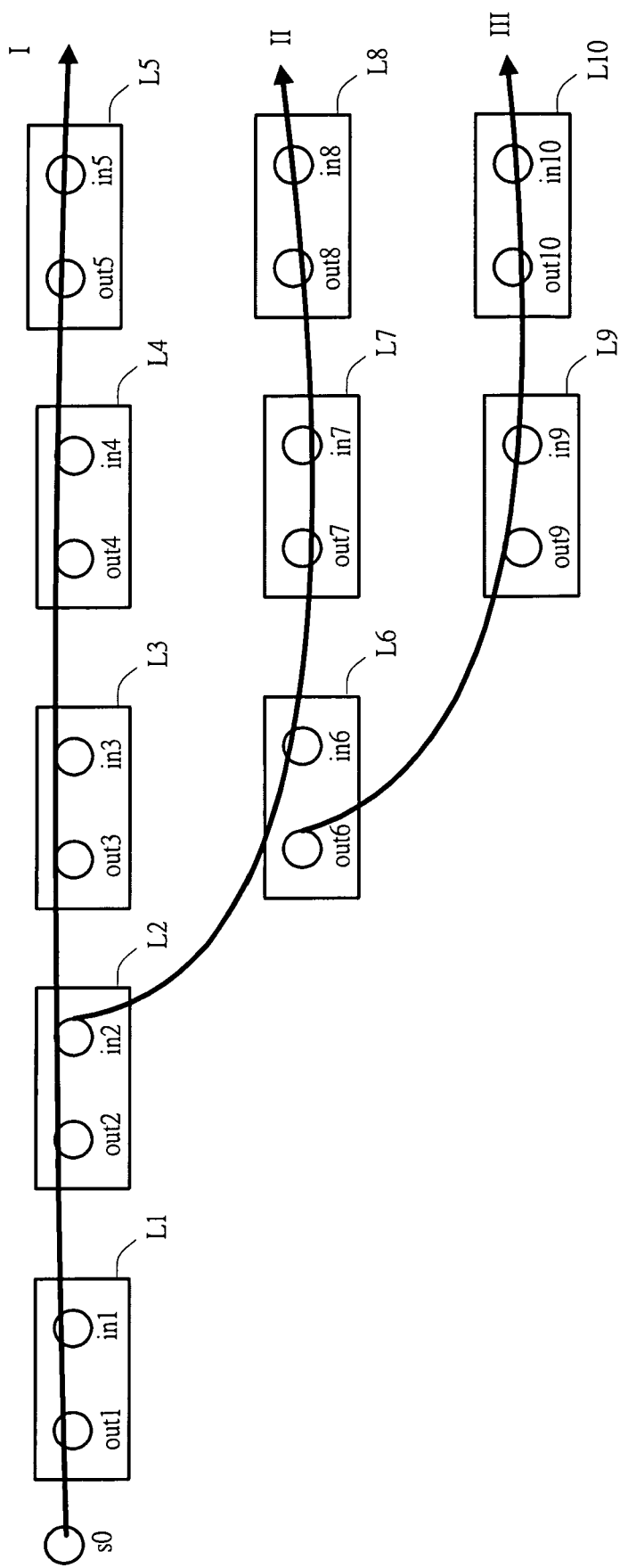
FIG. 5A is a scheme illustrating a second example of physical design without orientation optimization.
Figure 5B:
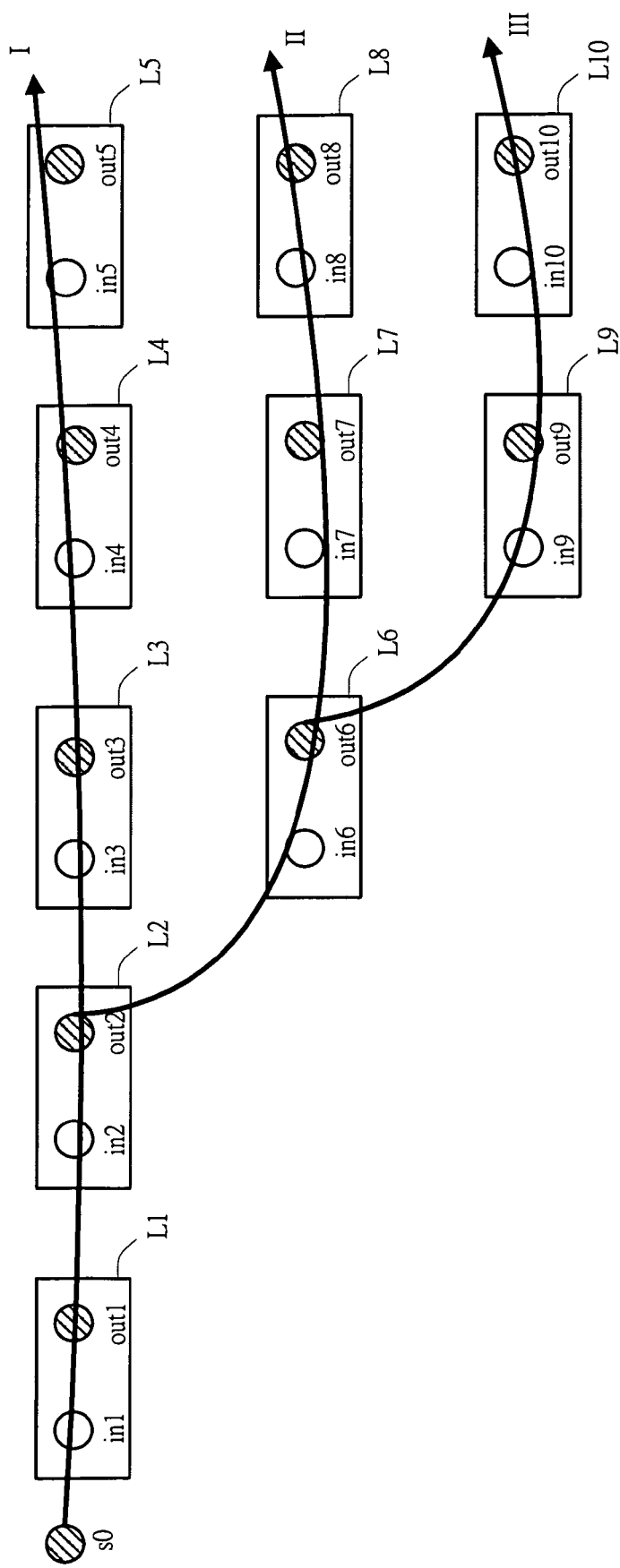
FIG. 5B is a scheme illustrating the physical design of FIG. 5A with orientation optimization according to the present invention.

Another example for orientation optimization of 2-pin logic cells according to the present invention is given with reference to FIG. 5A and FIG. 5B. In this example, ten 2-pin logic cells L1~L10 are interconnected to form three signal chain paths I, II and III according to a netlist. Before detail routing of an IC, all the signal chain paths are located. Then, outputs of all the standard 2-pin logic cells in the signal chain paths are set as gravity points (shown in the figures as shaded circles) for attracting the inputs of standard 2-pin logic cells in next stage. Accordingly, the 2-pin logic cells are optionally flipped so as to achieve the objective of orientation optimization. The orientation-optimized 2-pin logic cells are shown in FIG. 5B.

Figure 6A:
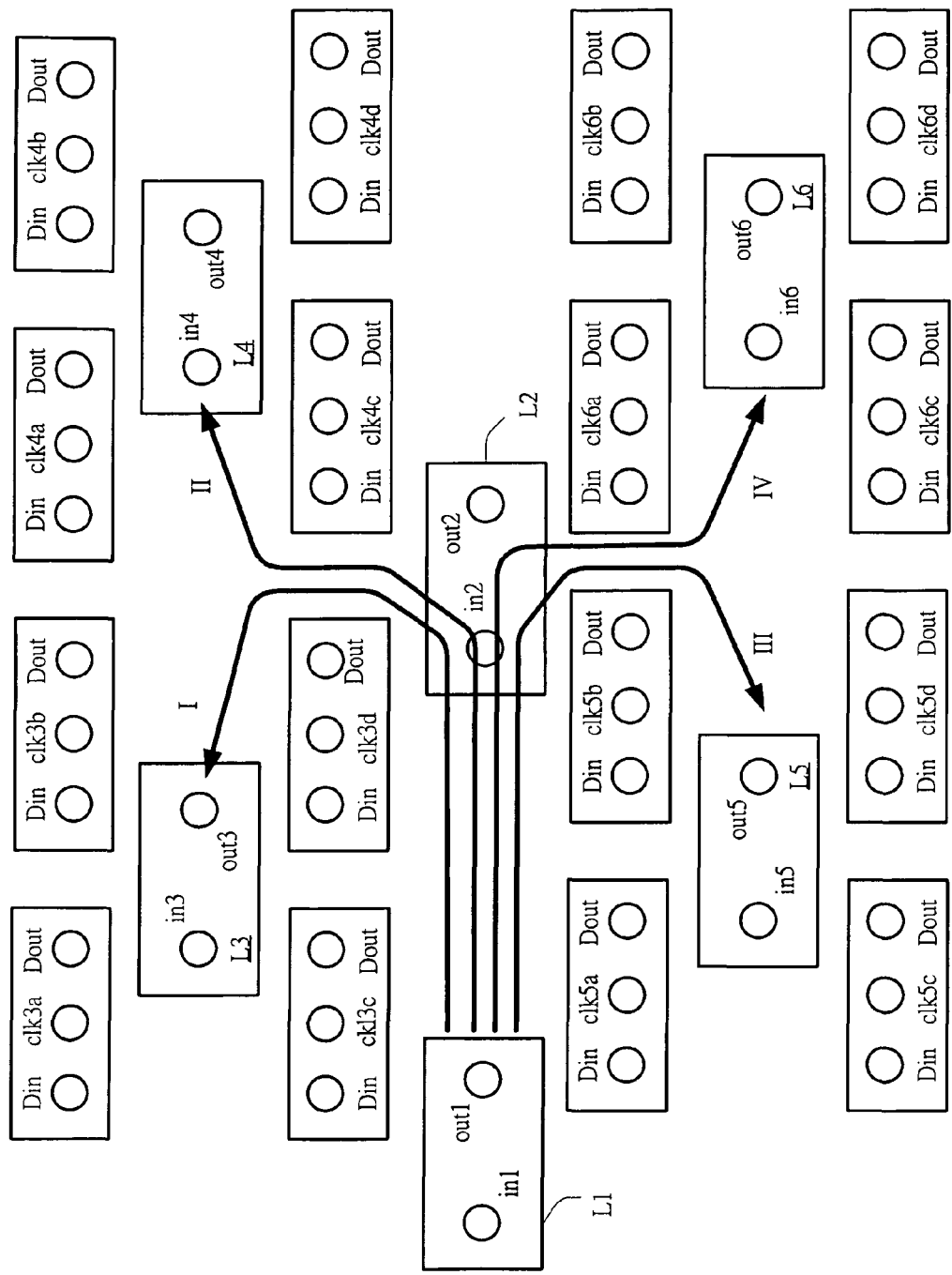
FIG. 6A is a scheme illustrating a third example of physical design without orientation optimization.
Figure 6B:
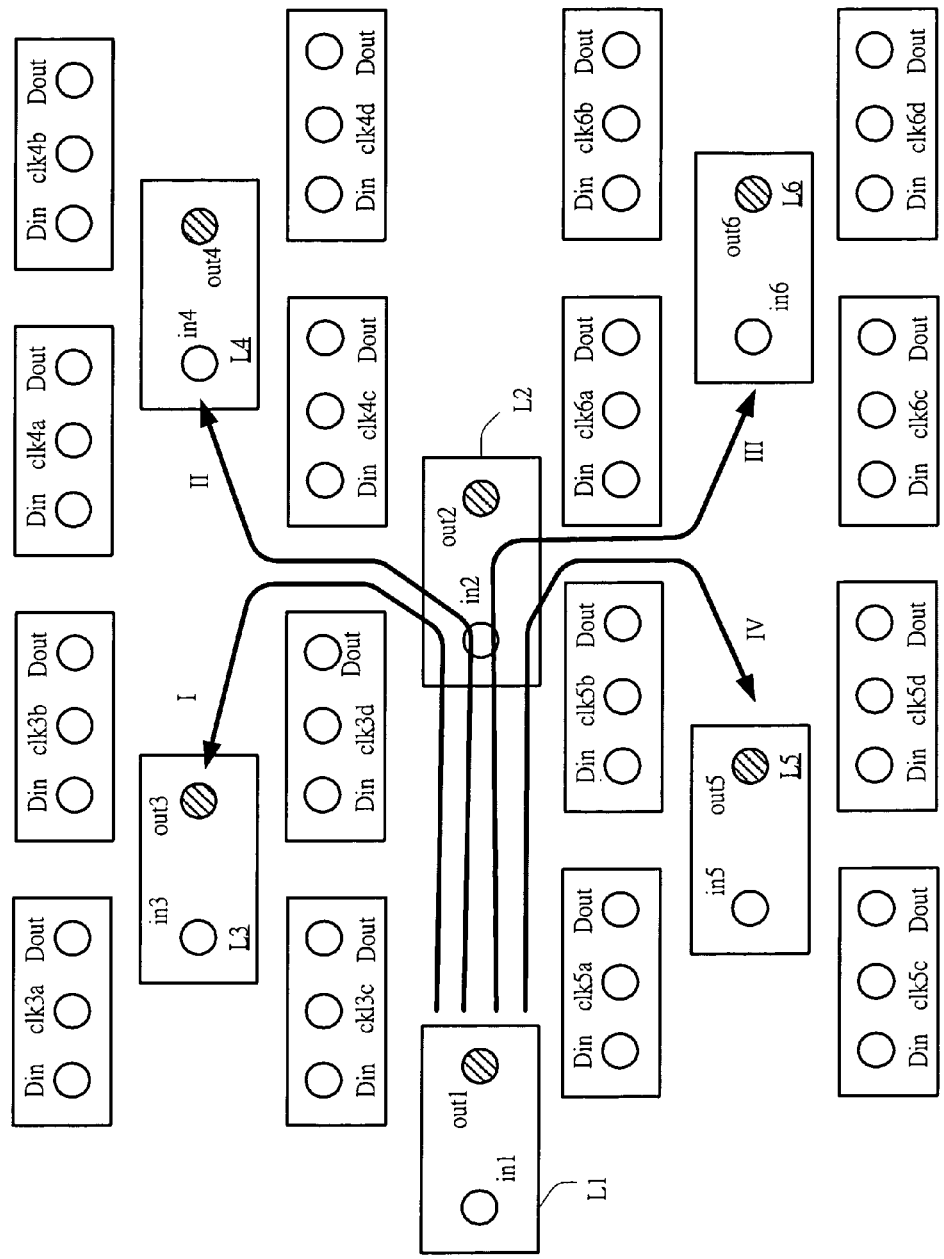
FIG. 6B is a scheme illustrating the physical design of FIG. 6A with the setting of gravity points before orientation optimization according to the present invention.

FIG. 6A and FIG. 6B illustrate a further example for orientation optimization of 2-pin logic cells according to the present invention. In this example, six 2-pin logic cells L1~L6 are interconnected to form three signal chain paths I, II, III and IV with the output (out1) of the first 2-pin logic cell L1 serving as a signal start source common to the four signal chain paths. That is, The first signal chain path I starts from the first 2-pin logic cell L1 and passes through the second 2-pin logic cell L2 and the third 2-pin logic cell L3; the second signal chain path II starts from the first 2-pin logic cell L1 and passes through the second 2-pin logic cell L2 and the fourth 2-pin logic cell L4; the third signal chain path III starts from the first 2-pin logic cell L1 and passes through the second 2-pin logic cell L2 and the fifth 2-pin logic cell L5; and the second signal chain path IV starts from the first 2-pin logic cell L1 and passes through the second 2-pin logic cell L2 and the sixth 2-pin logic cell L6.

After locating the signal chain paths I~IV, the outputs (out1, out2, out3, out4, out5, out6) of the 2-pin logic cells L1~L6 are set as gravity points to attract the inputs (in1, in2, in3, in4, in5, in6) of standard 2-pin logic cells in next stage. The orientation-optimized 2-pin logic cells are shown in FIG. 6B.

After the gravity points (shown by shaded circles) have been set, the inputs of the 2-pin logic cells in each stage are attracted by the gravity points of the preceding stage. For example, the input (in2) of the second 2-pin logic cell L2 is attracted by a first gravity point in the preceding stage, i.e. the output (out1) of the first 2-pin logic cell L1. Likewise, the inputs (in3, in4, in5, in6) of the second 2-pin logic cell L2, the third 2-pin logic cell L3, the fourth 2-pin logic cell L4 and the fifth 2-pin logic cell L5 are attracted by the second gravity point in the preceding stage, i.e. the output (out2) of the second 2-pin logic cell L2.

Figure 6C:
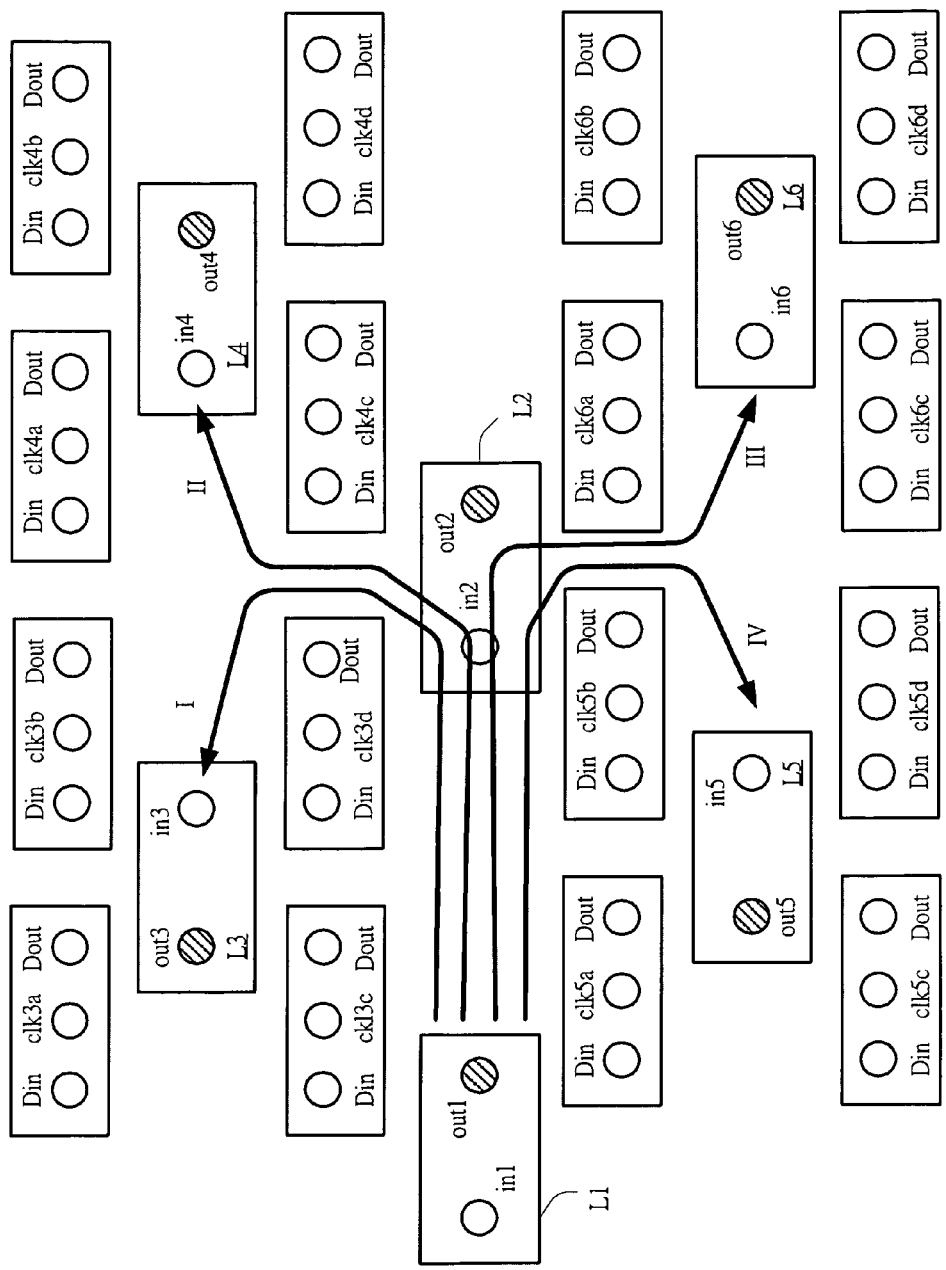
FIG. 6C is a scheme illustrating the physical design of FIG. 6B after orientation optimization according to the present invention.

As a result, the third 2-pin logic cell L3 and the fifth 2-pin logic cell L5 which are forbidden from flip according to the conventional nets-based flip algorithm are flipped, as shown in FIG. 6C, so as to reduce the total routing length.

FIG. 7 is a table of statistical data showing how the present orientation optimization method reduces the total routing length.

The table of FIG. 7 is built by experiments on three microcontrollers. Please refer to data of Microcontroller 1 listed in the second column of the table. The chip area of Microcontroller 1 is 1774 μm×1995 μm; Microcontroller 1 consists of 177393 standard logic cells wherein the number of 2-pin logic cells is 60043. Without orientation optimization in the placement stage, the total routing length is 8342801 μm. In contrast, with paths-based flip, the orientation of 18837 2-pin logic cells is optimized within one-minute run time, and the total routing length is reduced to 8337571 μm. In other words, 5230 μm routing length is saved. By applying the present orientation optimization method to Microcontroller 2 and Microcontroller 3 with data shown in the third and fourth columns of the table, the total routing length of Microcontroller 2 and Microcontroller 3 can be reduced by levels of 9475 μm and 6760 μm, respectively.

It is to be noted that the paths-based flip according to the present invention is not limited to be used in the placement stage.

Figure 8:
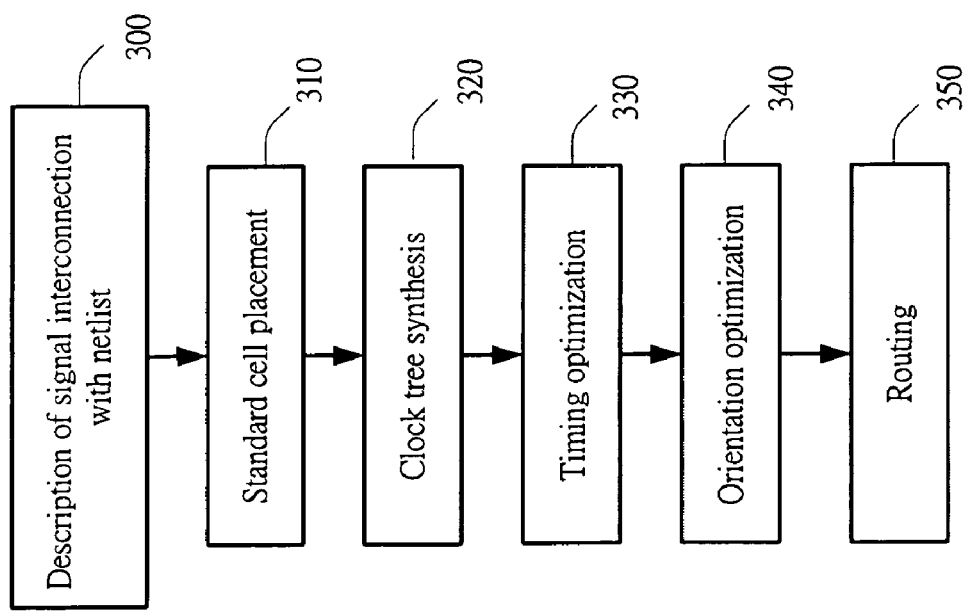
FIG. 8 is a flowchart of a physical design method according to an embodiment of the present invention.

FIG. 8 is a flowchart exemplifying an IC design flow according to the present invention. In Step 300, signal interconnection among standard logic cells is described according to a netlist. Then, all the 2-pin logic cells in the netlist are actually placed on a semiconductor substrate in a standard cell placement stage (Step 310). Afterwards, perform the synthesis of a clock tree (Step 320) to add 2-pin logic cells according to practical requirements. Next, enter a timing optimization step (Step 330) to calculate the delay time of 2-pin logic cells, and adjust the size and/or number of the 2-pin logic cells when necessary. After the above Steps 300~330 are completed, execute orientation optimization (Step 340) based on paths-based flip to obtain the orientation-optimized 2-pin logic cells. Then routing (Step 350) can be performed with minimized length.

In the above example, the orientation optimization based on paths-based flip according to the present invention is performed after Steps 300~330 are completed. Nevertheless, the orientation optimization based on paths-based flip according to the present invention can also be inserted into Steps 300~330. For example, paths-based flip can be used to set the gravity points, e.g. the outputs of the 2-pin logic cells, while standard cell placement (Step 310) is being performed. Then the clock tree synthesis (Step 320) is performed, and the 2-pin logic cells added in the clock tree synthesis (Step 320) are further subjected to paths-based flip for orientation optimization.

It is understood from the above descriptions and examples that the total routing length in a chip as well as the wire crossing probability can be efficiently reduced by way of orientation optimization based on paths-based flip.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An orientation optimization method of a 2-pin logic cell applied to a computer-aided design tool executed by a computer, comprising:
   (a) locating at least one signal chain path starting from a signal source and passing through a series of M 2-pin logic cells; and
   (b) setting an output of the Nth 2-pin logic cell in the series of M 2-pin logic cells, where N<M, as a gravity point to attract an input of the (N+1)th 2-pin logic cell, thereby optionally flipping the (N+1)th 2-pin logic cell.

2. The method according to claim 1 wherein each 2 pin logic cell is selected from an inverter, a buffer or a delay element.

3. The method according to claim 1 wherein the signal source serves as a gravity point to attract an input of the first 2-pin logic cell in the series of M 2-pin logic cells, and an output of the (N−1)th 2-pin logic cell in the series of M 2-pin logic cells serves as a gravity point to attract an input of the Nth 2-pin logic cell in the series of M 2-pin logic cells.

4. The method according to claim 1 wherein a plurality of signal chain paths are located according to a netlist.

5. The method according to claim 4 wherein the plurality of signal chain paths have a common signal source.

6. The method according to claim 4 wherein the plurality of signal chain paths forms a signal tree.

7. A physical design method applied to a computer-aided design tool executed by a computer, comprising:
    establishing a netlist which describes a signal interconnection among A 2-pin logic cells;
    performing a placement stage of the A 2-pin logic cells;
    synthesizing a clock tree with the addition of B 2-pin logic cells and a signal interconnection among the B 2-pin logic cells;
    performing a timing optimization to optionally change a size of the (A+B) 2-pin logic cells and optionally add C 2-pin logic cells;
    performing an orientation optimization based on paths-based flip to optionally flip the (A+B+C) 2-pin logic cells; and
    performing routing to obtain a physical circuit.

8. The method according to claim 7 wherein the orientation optimization includes:
    (a) locating at least one signal chain path starting from a signal source and passing through a series of M 2-pin logic cells; and
    (b) setting an output of the Nth 2-pin logic cell in the series of M 2-pin logic cells, where N<M, as a gravity point to attract an input of the (N+1)th 2-pin logic cell, thereby optionally flipping the (N+1)th 2-pin logic cell.

9. The method according to claim 8 wherein each 2 pin logic cell is selected from an inverter, a buffer or a delay element.

10. The method according to claim 8 wherein the signal source serves as a gravity point to attract an input of the first 2-pin logic cell in the series of M 2-pin logic cells, and an output of the (N−1)th 2-pin logic cell in the series of M 2-pin logic cells serves as a gravity point to attract an input of the Nth 2-pin logic cell in the series of M 2-pin logic cells.

11. The method according to claim 8 wherein a plurality of signal chain paths are located according to the netlist.

12. The method according to claim 11 wherein the plurality of signal chain paths have a common signal source.

13. The method according to claim 11 wherein the plurality of signal chain paths forms a signal tree.

14. A physical design method applied to a computer-aided design tool executed by a computer, comprising:
    establishing a netlist which describes a signal interconnection among A 2-pin logic cells;
    performing a placement stage of the A 2-pin logic cells;
    performing an orientation optimization based on paths-based flip to optionally flip the A 2-pin logic cells;
    synthesizing a clock tree with the addition of B 2-pin logic cells and a signal interconnection among the B 2-pin logic cells;
    performing a timing optimization to optionally change a size and/or number of 2-pin logic cells;
    performing an orientation optimization based on paths-based flip to optionally flip the added 2-pin logic cells;
    performing routing to obtain a physical circuit.

15. The method according to claim 14 wherein the orientation optimization includes:
    (a) locating at least one signal chain path starting from a signal source and passing through a series of M 2-pin logic cells; and
    (b) setting an output of the Nth 2-pin logic cell in the series of M 2-pin logic cells, where N<M, as a gravity point to attract an input of the (N+1)th 2-pin logic cell, thereby optionally flipping the (N+1)th 2-pin logic cell.

16. The method according to claim 15 wherein the signal source serves as a gravity point to attract an input of the first 2-pin logic cell in the series of M 2-pin logic cells, and an output of the (N−1)th 2-pin logic cell in the series of M 2-pin logic cells serves as a gravity point to attract an input of the Nth 2-pin logic cell in the series of M 2-pin logic cells.

17. The method according to claim 14 wherein each 2 pin logic cell is selected from an inverter, a buffer or a delay element.

18. The method according to claim 14 wherein a plurality of signal chain paths are located according to the netlist.

19. The method according to claim 18 wherein the plurality of signal chain paths have a common signal source.

20. The method according to claim 18 wherein the plurality of signal chain paths forms a signal tree.

* * * * *